(12) United States Patent
Kon

(10) Patent No.: US 9,960,382 B2
(45) Date of Patent: May 1, 2018

(54) ORGANIC ELECTROLUMINESCENCE ELEMENT, DISPLAY PANEL, AND METHOD FOR MANUFACTURING ORGANIC ELECTROLUMINESCENCE ELEMENT

(71) Applicant: NEC LIGHTING, LTD., Tokyo (JP)

(72) Inventor: Shusaku Kon, Tokyo (JP)

(73) Assignee: NEC LIGHTING, LTD., Tokyo (JP)

( * ) Notice: Subject to any disclaimer, the term of this patent is extended or adjusted under 35 U.S.C. 154(b) by 0 days. days.

(21) Appl. No.: 14/896,520

(22) PCT Filed: Apr. 30, 2014

(86) PCT No.: PCT/JP2014/061973
§ 371 (c)(1),
(2) Date: Dec. 7, 2015

(87) PCT Pub. No.: WO2014/199741
PCT Pub. Date: Dec. 18, 2014

(65) Prior Publication Data
US 2016/0126490 A1 May 5, 2016

(30) Foreign Application Priority Data
Jun. 11, 2013 (JP) ................. 2013-123188

(51) Int. Cl.
*H01L 51/52* (2006.01)
*H01L 27/32* (2006.01)
(Continued)

(52) U.S. Cl.
CPC ...... *H01L 51/5228* (2013.01); *H01L 27/3276* (2013.01); *H01L 51/0021* (2013.01);
(Continued)

(58) Field of Classification Search
CPC ....................................................... H01L 51/52
See application file for complete search history.

(56) References Cited

U.S. PATENT DOCUMENTS

| 2008/0233287 A1 | 9/2008 | Shtein et al. |
| 2013/0126853 A1 | 5/2013 | Nakamura et al. |
| 2014/0014939 A1* | 1/2014 | Sakaguchi .......... H01L 51/5253 257/40 |

FOREIGN PATENT DOCUMENTS

| JP | 2006-253302 | 9/2006 |
| JP | 2011-040167 | 2/2011 |

(Continued)

OTHER PUBLICATIONS

International Search Report, PCT/JP2014/061973, dated Jun. 24, 2014.
(Continued)

*Primary Examiner* — Fernando L Toledo
*Assistant Examiner* — Valerie N Newton
(74) *Attorney, Agent, or Firm* — Young & Thompson

(57) ABSTRACT

Disclosed is an organic electroluminescence element that can provide uniform light emission over the entire surface and also can reduce the risk of short circuit and leakage. An organic electroluminescence element 10 according to the present invention includes a substrate 1, a first electrode 2, a second electrode 5, an organic layer 4 including a light-emitting layer, and an auxiliary wiring layer 3. The first electrode 2, the organic layer 4, and the second electrode 5 are laminated on one surface of the substrate 1 in this order. The organic layer 4 is connected electrically to both the electrodes. The auxiliary wiring layer 3 is arranged at a position where the auxiliary wiring layer 3 is not in contact with the organic layer 4. The auxiliary wiring layer 3 is connected electrically to the second electrode 5 and is not in contact with the first electrode 2.

20 Claims, 5 Drawing Sheets

(51) Int. Cl.
*H01L 51/00* (2006.01)
*H01L 51/56* (2006.01)

(52) U.S. Cl.
CPC ...... *H01L 51/5212* (2013.01); *H01L 51/5237* (2013.01); *H01L 51/56* (2013.01); *H01L 2251/5361* (2013.01); *H01L 2251/5392* (2013.01)

(56) References Cited

FOREIGN PATENT DOCUMENTS

| JP | 2012043799 A | 3/2012 |
| WO | WO 2012/114616 | 8/2012 |
| WO | WO 2012/133715 | 10/2012 |

OTHER PUBLICATIONS

Japanese Official Action dated Dec. 20, 2017; Application No. 2015-522641.

\* cited by examiner

ORGANIC ELECTROLUMINESCENCE ELEMENT, DISPLAY PANEL, AND METHOD FOR MANUFACTURING ORGANIC ELECTROLUMINESCENCE ELEMENT

TECHNICAL FIELD

The present invention relates to an organic electroluminescence element, a display panel, and a method for manufacturing an organic electroluminescence element.

BACKGROUND ART

Organic electroluminescence elements (organic EL elements) are characterized in that they are all-solid-type thin light sources that can operate with a low voltage direct current source. In addition to these characteristics, they also have characteristics that are not seen in other light sources, such as transparency and flexibility.

In an organic EL element, an electrode on the light emitting side generally is an electrode formed of a transparent conductive material such as indium tin oxide (ITO) or zinc oxide (ZnO). By using such a transparent conductive material, it is possible to achieve desired transparency. However, the transparency is in a trade-off relationship with electrical conductivity. That is, while the transparent conductive material is excellent in transparency, it also has high resistivity.

An organic EL element can be produced by forming a first electrode, an organic layer including a light-emitting layer (may be referred to simply as "organic layer" hereinafter), and a second electrode on a transparent substrate in this order, for example. During this process, damage to the organic layer at the time of forming the second electrode is perceived as a problem. The second electrode generally is formed (deposited) by sputtering. Sputtering applies higher energy to a base film during deposition as compared with vapor deposition, and thus may deteriorate the organic layer. However, if the second electrode is formed under the deposition conditions adjusted so as to reduce the damage during the sputtering, it is difficult to allow the second electrode to have a resistivity required in the case where the second electrode is formed on a transparent substrate. Thus, the second electrode has a higher resistivity than the first electrode. Therefore, owing to the influence of voltage drop caused by the resistance of the second electrode, it becomes difficult to obtain uniform light emission over the entire surface.

In order solve the above-described problem, forming an auxiliary wiring layer using a low resistance material such as a metal has been proposed. For example, Patent Document 1 discloses an auxiliary wiring layer (auxiliary electrode) arranged so as to be connected electrically to an electrode. By providing an auxiliary wiring layer formed of a metal having a high electric conductivity together with the electrode as described above, it is possible to alleviate the non-uniformity in light emission.

CITATION LIST

Patent Document(s)

Patent Document 1: JP 2006-253302 A

SUMMARY OF INVENTION

Problem to be Solved by the Invention

However, in the step of forming an auxiliary wiring layer, it is necessary to use a shadow mask for film deposition, for example. A shadow part of the shadow mask (a part other than the opening part) is in contact with a film deposition surface of the first electrode, the organic layer, or the second electrode. Thus, owing to asperities or metal particles present on the surface of the shadow mask, the contact surface of the first electrode, the organic layer, or the second electrode with the shadow mask may be damaged, and this may cause malfunctions such as a short circuit and leakage.

With the foregoing in mind, it is an object of the present invention to provide an organic electroluminescence element that can provide uniform light emission over the entire surface and also can reduce the risk of short circuit and leakage by forming an auxiliary wiring layer without using a shadow mask in the step of forming the auxiliary wiring layer, a display panel including the organic electroluminescence element, and a method for manufacturing the organic electroluminescence element.

Means for Solving Problem

In order to achieve the above object, the present invention provides an organic electroluminescence element including: a substrate; a first electrode; a second electrode; an organic layer including a light-emitting layer; and an auxiliary wiring layer. The first electrode, the organic layer, and the second electrode are laminated on one surface of the substrate in this order. The organic layer are connected electrically to both the electrodes. The auxiliary wiring layer is arranged at a position where the auxiliary wiring layer is not in contact with the organic layer. The auxiliary wiring layer is connected electrically to the second electrode, and the auxiliary wiring layer is not in contact with the first electrode.

The present invention also provides a display panel including the organic electroluminescence element of the present invention.

The present invention also provides a method for manufacturing an organic electroluminescence element, including: a first electrode forming step of forming a first electrode on one surface of a substrate; an organic layer forming step of forming an organic layer including a light-emitting layer on the first electrode; a second electrode forming step of forming a second electrode on the organic layer; and an auxiliary wiring layer forming step of forming an auxiliary wiring layer at a position where the auxiliary wiring layer is not in contact with the organic layer. In the auxiliary wiring layer forming step, the auxiliary wiring layer is formed so as not to be in contact with the first electrode. In the auxiliary wiring layer forming step or the second electrode forming step, the auxiliary wiring layer is connected electrically to the second electrode.

Effects of the Invention

According to the organic electroluminescence element, the display panel, and the method for manufacturing the organic electroluminescence element of the present invention, uniform light emission can be obtained from the entire surface. Also, because the auxiliary wiring layer is formed without using a shadow mask in the auxiliary wiring layer forming step, the risk of short circuit and leakage can be reduced.

BRIEF DESCRIPTION OF DRAWINGS

FIG. 1 shows an example of the configuration of the organic EL element of the present invention.

FIG. 3 shows another example of the configuration of the organic EL element of the present invention.

FIG. 6 shows still another example of the configuration of the organic EL element of the present invention.

MODE FOR CARRYING OUT THE INVENTION

Figure 1A:
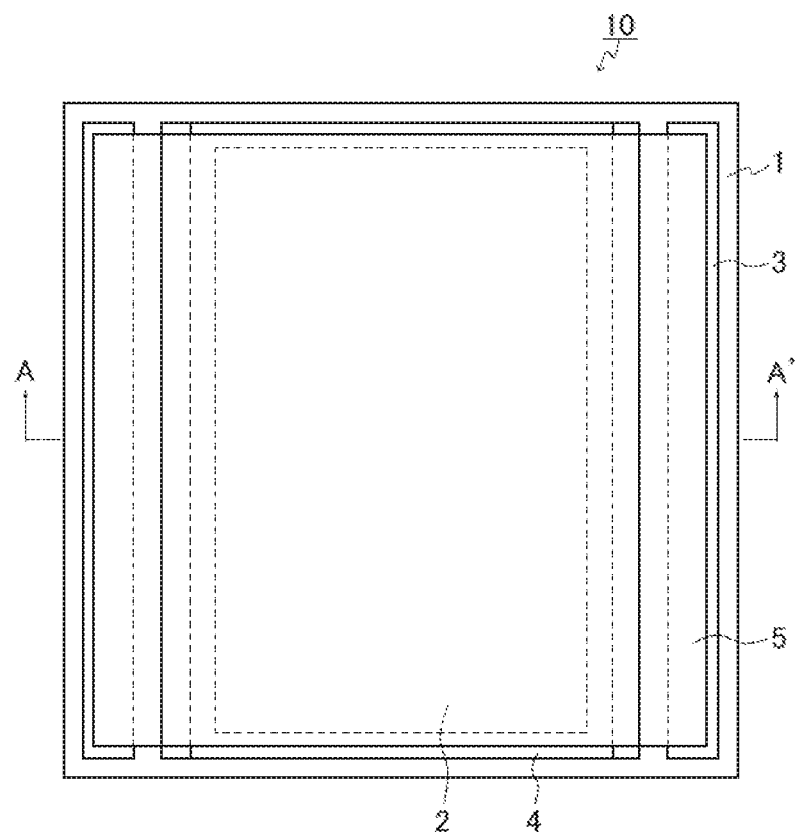
FIG. 1A is a top view (plan view) and FIG. 1B is a sectional view of the organic EL element.

The present invention will be described specifically below with reference to illustrative examples. It is to be noted, however, that the present invention is by no means limited by the following description. In FIGS. 1 to 6 to be described below, the same components are given the same reference numerals, and duplicate explanations thereof may be omitted. Also, in the drawings, the structure of each component may be shown in a simplified form as appropriate for the sake of convenience in illustration, and also, each component may be shown schematically with a dimension ratio and the like that are different from the actual dimension ratio and the like.

First Exemplary Embodiment

Figure 1B:
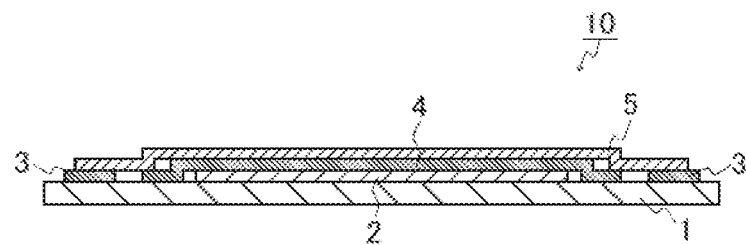
Figure 2:
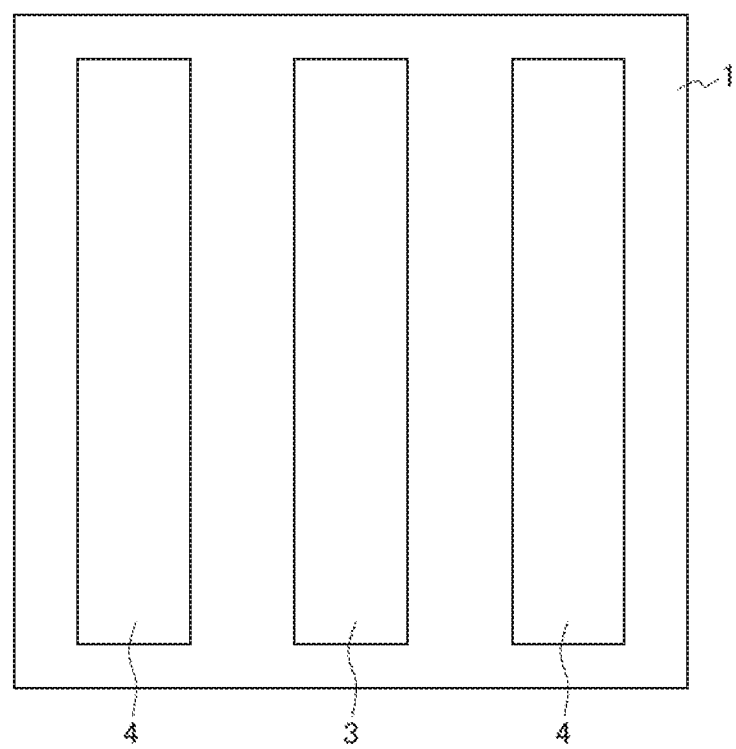
FIG. 2 is a top view (plan view) showing another example of the arrangement of an auxiliary wiring layer in the organic EL element of the present invention.

FIG. 1 shows an example of the configuration of the organic EL element of the present invention. FIG. 1A is a top view (plan view) of the organic EL element, and FIG. 1B is a sectional view of the same, viewed along arrows A-A' in FIG. 1A. As shown in FIG. 1, this organic EL element 10 includes a substrate 1, a first electrode 2, auxiliary wiring layers 3, an organic layer 4 including a light-emitting layer, and a second electrode 5. The first electrode 2, the organic layer 4, and the second electrode 5 are laminated on a surface of the substrate 1 in this order. The organic layer 4 is in contact (direct contact) with both the electrodes, whereby the organic layer 4 is connected electrically to both the electrodes. Each end portion of the organic layer 4 protrudes toward the outside of the first electrode 2 and is in contact with the surface of the substrate 1. On the surface of the substrate 1, each of the auxiliary wiring layers 3 is arranged slightly apart from the organic layer 4 (at a position where the auxiliary wiring layer is not in contact with the organic layer 4) on the outside of the organic layer 4. With this configuration, each of the auxiliary wiring layers 3 also is arranged apart from the first electrode 2 (at a position where the auxiliary wiring layer is not in contact with the first electrode 2) on the outside of the first electrode 2. Furthermore, each end portion of the second electrode 5 protrudes toward the outside of the organic layer 4 and covers a portion of the upper surface of the auxiliary wiring layer 3. With this configuration, the auxiliary wiring layers 3 are in contact with the end portions of the second electrode 5.

In FIG. 1, the organic layer 4 is in contact (direct contact) with both the electrodes. It is to be noted, however, that, in the organic EL element of the present invention, it is not always necessary that the organic layer is in direct contact with both the electrodes, as long as the organic layer is connected electrically to both the electrodes. Also, the organic layer 4 may be configured so that, for example, only a portion of the organic layer 4 is sandwiched between both the electrodes as shown in FIG. 1 or the entire organic layer 4 is sandwiched between both the electrodes as shown in FIG. 3 to be described below. In FIG. 1, the auxiliary wiring layers 3 are in contact with the second electrode 5. It is to be noted, however, that, in the present invention, it is not always necessary that the auxiliary wiring layers are in direct contact with the second electrode as long as the auxiliary wiring layers are connected electrically to the second electrode. In the present invention, the arrangement of the auxiliary wiring layers is not limited to the one shown in FIG. 1, and any arrangement may be employed, as long as: the auxiliary wiring layers are arranged at a position where the auxiliary wiring layers are not in contact with the organic layer on the outside of the organic layer; the auxiliary wiring layers are connected electrically to the second electrode; and the auxiliary wiring layers are not in contact with the first electrode. Although the first electrode 2 is in contact with a portion of the upper surface of the substrate 1, it is not always necessary that the first electrode 2 is in contact with the substrate 1. Furthermore, although portions (both ends) of the organic layer 4 are in contact with the upper surface of the substrate 1 in FIG. 1, it is not always necessary that the organic layer 4 is in contact with the substrate 1.

A material for forming the substrate 1 is not particularly limited, and may be, for example, an inorganic material or an organic material. Examples of the inorganic material include alkali-free glass, soda-lime glass, borosilicate glass, aluminosilicate glass, and quartz glass. Examples of the organic material include: polyester resins such as polyethylene naphthalate and polyethylene terephthalate; acrylic resins such as ethyl methacrylate, methyl methacrylate, ethyl acrylate, and methyl acrylate; alicyclic olefin resins such as a copolymer of norbornene and ethylene; polyether sulfone; and triacetyl cellulose. The thickness of the substrate 1 is not particularly limited, and can be set as appropriate depending on the material for forming the substrate 1, environment in which the substrate 1 is used, and the like, for example.

In the organic EL element 10 shown in FIG. 1, the substrate 1 has a single layer structure. It is to be noted, however, that the present invention is not limited to this illustrative example, and the substrate may have a multilayer structure, for example.

The first electrode 2 and the second electrode 5 are not particularly limited, and they may each be a transparent conductive thin film formed by a conventionally known method such as sputtering, for example. A material for forming the transparent conductive thin film also is not particularly limited, and examples thereof include ITO, ZnO, IZO (registered trademark, indium-zinc oxide), IGZO (indium-gallium-zinc oxide), GZO (gallium-zinc oxide), and $SnO_2$.

In the organic EL element of the present invention, in order to extract light emitted from the organic layer, one or both of the following conditions need to be satisfied: the substrate and the first electrode both transmit light (transparent); and the second electrode transmits light (transparent). Light-transmitting (transparent) materials for forming the substrate, the first electrode, and the second electrode are not particularly limited, and examples thereof include the materials described above as examples of the materials for forming the respective components.

The organic layer 4 is not particularly limited as long as it includes a light-emitting layer, and may have the same configuration as an organic layer in a common organic EL element, for example. The organic layer 4 may be configured so as to include, for example: a light-emitting layer containing an organic electroluminescent material; a hole transport layer and an electron transport layer that sandwich the light-emitting layer; and further, a hole injection layer and an electron injection layer that sandwich the hole transport layer and the electron transport layer. The organic layer 4 further may include, for example, a carrier block layer that improves light emission efficiency by blocking holes or electrons. The organic layer 4 may be a laminate including the hole injection layer, the hole transport layer, the light-emitting layer, the electron transport layer, and the electron injection layer laminated in this order from the first electrode 2 side, for example.

The hole injection layer is provided in order to lower the height of an injection barrier with respect to holes injected from the first electrode 2 (anode) to the organic layer 4, and to reduce the difference in energy level between the anode and the hole transport layer so as to allow the holes injected from the anode to be easily injected to the hole transport layer. The hole injection layer is formed of a hole injection layer material. The hole injection layer material may be, for example, an organic hole injection material, and specific examples thereof include copper phthalocyanine and arylamine derivatives such as star-burst type aromatic amines. In order to further lower the injection barrier so as to lower the driving voltage, the organic hole injection material may be chemically doped with an inorganic substance such as vanadium pentoxide or molybdenum trioxide or an organic substance such as F4-TCNQ, for example.

The hole transport layer preferably is formed of a hole transport layer material. The hole transport layer material is a material that has an appropriate ionization potential to enhance the mobility of holes to the light-emitting layer, and at the same time, has an electron affinity to prevent electron leakage from the light-emitting layer. Specific examples of the hole transport layer material include triphenyldiamines and star-burst type aromatic amine. Examples of the triphenyldiamines include bis(di(p-tolyl)aminophenyl)-1,1-cyclohexane, 4,4'-bis(m-tolylphenylamino)biphenyl (TPD), and N,N'-diphenyl-N—N-bis(1-naphthyl)-1,1'-biphenyl-4, 4'-diamine (α-NPD).

The light-emitting layer is a layer that emits fluorescence, phosphorescence, or the like by recombination of electrons injected from the electrode with holes. The light-emitting layer contains a light-emitting material. Examples of the light-emitting material include: low molecular weight compounds such as tris(8-quinolinol) aluminum complex ($Alq_3$), bisdiphenylvinylbiphenyl (BDPVBi), 1,3-bis(p-t-butylphenyl-1,3,4-oxadiazolyl)phenyl (OXD-7), N,N'-bis(2,5-di-t-butylphenyl) perylenetetracarboxylic acid diimide (BPPC), and 1,4-bis(N-p-tolyl-N-4-(4-methylstyryl)phenylamino) naphthalene; and high molecular weight compounds such as polyphenylene vinylene polymers.

The light-emitting material also may be, for example, a two-component material containing a host and a dopant, in which energy in the excited state generated by host molecules migrates to dopant molecules, and the dopant molecules emit light. Examples of such a light-emitting material include the above-described light-emitting materials, electron transport layer materials to be described below, and the above-described hole transport layer materials. Specifically, the light-emitting material may be, for example: a material obtained by doping a quinolinol metal complex such as $Alq_3$ as a host with 4-dicyanomethylene-2-methyl-6-(p-dimethylaminostyryl)-4H-pyran (DCM), a quinacridone derivative such as 2,3-quinacridone, or a coumarin derivative such as 3-(2'-benzothiazole)-7-diethylaminocoumarin as a dopant; a material obtained by doping a bis(2-methyl-8-hydroxyquinoline)-4-phenylphenol-aluminum complex, which is an electron transport material as a host, with a fused polycyclic aromatic compound such as perylene as a dopant; a material obtained by doping 4,4'-bis (m-tolylphenylamino)biphenyl (TPD), which is a hole transport layer material as a host, with rubrene or the like as a dopant; or a material obtained by doping a carbazole compound such as 4,4'-biscarbazolyl-biphenyl (CBP) or 4,4'-bis(9-carbazolyl)-2,2'-dimethylbiphenyl (CDBP) as a host with a platinum complex or an iridium complex such as tris-(2-phenylpyridine)iridium ($Ir(ppy)_3$), bis[(4,6-di-fluorophenyl)-pyridinato-N,C2]iridium (picolinate) (FIr(pic)), bis(2-2'-benzothienyl)-pyridinato-N, C3 iridium (acetylacetonato) ($Btp_2Ir(acac)$), tris-(picolinate) iridium ($Ir(pic)_3$), or bis(2-phenylbenzothiozolate-N,C2) iridium (acetylacetonate) ($Bt_2Ir(acac)$) as a dopant.

The above-described light-emitting material can be selected as appropriate depending on the color of light emission to be obtained by an organic EL lighting panel, for example.

Specifically, for example, in the case where green light emission is to be obtained, $Alq_3$ can be selected as a host and quinacridone, coumarin, or the like can be selected as a dopant, or alternatively, CBP can be selected as a host and $Ir(ppy)_3$ or the like can be selected as a dopant. In the case where blue light emission is to be obtained, 4,4'-bis(2,2-diphenylethenyl)-1,1'-biphenyl (DPVBi) can be selected as a host and perylene, a distyrylarylene derivative, or the like can be selected as a dopant, or alternatively, CBP can be selected as a host and FIr(pic) or the like can be selected as a dopant. In the case where green to blue-green light emission is to be obtained, $Alq_3$ can be selected as a host and OXD-7 or the like can be selected as a dopant. In the case where red to orange light emission is to be obtained, $Alq_3$ can be selected as a host and DCM or 4-(dicyanomethylene)-2-t-butyl-6-(1,1,7,7-tetramethyljulolidyl-9-enyl)-4H-pyran (DCJTB) can be selected as a dopant, or alternatively, CBP can be selected as a host and $Ir(pic)_3$ or the like can be selected as a dopant. In the case where yellow light emission is to be obtained, $Alq_3$ can be selected as a host and rubrene can be selected as a dopant, or alternatively, CBP can be selected as a host and $Bt_2Ir(acac)$ or the like can be selected as a dopant.

The light-emitting layer for white light emission may have, for example, a three-layer laminated structure including layers containing light-emitting materials for light emission of red, green, and blue, respectively. Other examples of the light-emitting layer for white light emission include: a layer having a two-layer laminated structure including layers containing light-emitting materials for light emission of complementary colors such as blue and yellow; and a layer having a single layer structure containing light-emitting materials of these colors, obtained by forming these light-emitting materials into a film by multi-component codeposition or the like. The light-emitting layer for white light also may be a layer formed by providing light-emitting materials contained in the respective color layers in the above-described layer having the three-layer or two-layer laminated structure in the form of fine pixels of red, blue, green, and the like arranged two-dimensionally in sequence, for example.

The electron transport layer preferably is formed of an electron transport layer material. The electron transport layer material is a material that has an appropriate ionization potential to enhance the mobility of electrons to the light-emitting layer, and at the same time, has an electron affinity to prevent hole leakage from the light-emitting layer. Specific examples of the electron transport layer material include organic materials such as: oxadiazole derivatives such as 2-(4-biphenylyl)-5-(4-t-butylphenyl)-1,3,4-oxadiazole (Bu-PBD) and OXD-7; triazole derivatives; and quinolinol metal complexes. The electron transport layer material may be obtained by chemically doping the above-described organic material with an electron-donating substance like an alkali metal such as lithium, for example.

The electron injection layer is provided in order to alleviate a problem in that, for example, injection of electrons from a cathode to the electron transport layer becomes difficult owing to a large difference in energy between the work function of a metal material such as aluminum used for forming the cathode and the electron affinity (LUMO level) of the electron transport layer. The electron injection layer preferably is formed of an electron injection layer material. The electron injection layer material may be a material having a small work function. More specifically, such a material may be, for example: a fluoride or an oxide of an alkali metal such as lithium or cesium or an alkaline-earth metal such as calcium; magnesium silver; or a lithium aluminum alloy.

The carrier block layer may be a hole block layer, for example. The hole block layer is provided between the light-emitting layer and the electron transport layer in order to block holes that pass through the light-emitting layer without contributing to light emission, thereby increasing the recombination probability in the light-emitting layer. Examples of the material for forming the hole block layer include 2,9-dimethyl-4,7-diphenyl-1,10-phenanthroline (BCP), triphenyldiamine derivatives, and triazole derivatives.

The thickness of the organic layer 4 is not particularly limited. For example, each of the layers included in the organic layer 4 has a thickness in the range from 1 to 500 nm, and the total thickness of these layers is in the range from 100 nm to 1000 nm, for example.

Specific examples of the material for forming the auxiliary wiring layers 3 include Cr (chromium), Cu (copper), Al (aluminum), Ag (silver), Au (gold), Mo (molybdenum), W (tungsten), Ni (nickel), and the alloys thereof. Examples of the alloy include Al—Mo (aluminum-molybdenum), Al—Nd (aluminum-neodymium), Al—Ni (aluminum-nickel), and Mo—Nb (molybdenum-niobium). Among them, a three-layered laminate of Mo—Nb/Al-Nd/Mo—Nb (MAM) is particularly preferable in terms of environment-friendliness, reliability, and general versatility (price). The volume resistivity of the material for forming the auxiliary wiring layers 3 preferably is in the range from $1.59 \times 10^{-8}$ to $13 \times 10^{-8}$ $\Omega \cdot m$, more preferably in the range from $1.59 \times 10^{-8}$ to $7 \times 10^{-8}$ $\Omega \cdot m$, at 20° C. The lower limit of the volume resistivity "$1.59 \times 10^{-8}$ $\Omega \cdot m$" is the resistance of Ag (silver), which has the lowest resistance. It is preferable that the volume resistivity is in the above-described range, because it enhances the effect of lowering the wiring resistance on the electrode side. In order to lower the resistivity of the second electrode by the auxiliary wiring layers, it is preferable that the auxiliary wiring layers are as thick and wide as possible. However, in terms of the appearance of the organic EL element, it is preferable that the auxiliary wiring layers are not too wide. Also, when the auxiliary wiring layers are too thick, they may cause a phenomenon in which a layer formed on the auxiliary wiring layers may be broken at a portion where a level difference is provided by the auxiliary wiring layer and a layer under the auxiliary wiring layer (step disconnection). On this account, it is preferable that the auxiliary wiring layers are not too thick. The width of the auxiliary wiring layer is not particularly limited, and may be 1 to 4 mm, for example. When the above-described laminate of MAM is used as the auxiliary wiring layer, the thicknesses of the respective layers preferably are as follows: the Mo—Nb layer is in the range from 30 nm to 50 nm; the Al—Nd layer is in the range from 200 nm to 500 nm; and the Mo—Nb layer in the range from 30 nm to 50 nm. For example, the laminate can be obtained by laminating a 50 nm thick Mo alloy, a 400 nm thick Al alloy, and a 50 nm Mo alloy in this order.

In the organic EL element 10 shown in FIG. 1, the auxiliary wiring layers 3 are in contact with the second electrode 5, whereby the auxiliary wiring layers 3 are connected electrically to the second electrode 5. With this configuration, it is possible to obtain uniform light emission over the entire surface. As shown in FIG. 1, the auxiliary wiring layers 3 may be arranged on both end sides (on the right and left in FIG. 1) of the organic layer 4, for example. Alternatively, the auxiliary wiring layer 3 may be arranged on one end side of the organic layer 4. However, it is preferable to arrange the auxiliary wiring layers 3 on both end sides of the organic layer 4, because it allows more uniform light emission. Although not shown in the drawings, it is more preferable to arrange the auxiliary wiring layer(s) 3 so as to surround the organic layer 4 at least partially because it allows still more uniform light emission, and it is particularly preferable to arrange the auxiliary wiring layer(s) 3 so as to surround the organic layer 4 entirely. As long as the auxiliary wiring layer 3 is arranged at a position where it is not in contact with the organic layer 4, the position of the auxiliary wiring layer 3 is not limited to the outside of the organic layer 4. Specifically, for example, as shown in the top view (plan view) of FIG. 2, an auxiliary wiring layer 3 may be arranged approximately in the middle of a surface of the substrate 1, and organic layers 4 may be arranged apart from the auxiliary wiring layer 3 so as not to be in contact with the auxiliary wiring layer 3 on the outside of the auxiliary wiring layer 3 (both end sides on the right and left of the auxiliary wiring layer 3 in FIG. 2). It is to be noted that, in the organic EL element shown in FIG. 2, components other than the substrate 1, the auxiliary wiring layer 3, and the organic layers 4 are not shown for the sake of simplify in illustration. The other components are not particularly limited. For example, the organic EL element shown in FIG. 2 may be configured so that, as in the case of the organic EL element 10 shown in FIG. 1, a first electrode is provided between the substrate 1 and the organic layers 4, and a second electrode covers upper surfaces of the auxiliary wiring layer 3 and the organic layers 4. Although not shown in the drawings, the organic EL element may be configured so that, for example, an auxiliary wiring layer is arranged approximately in the middle of a surface of the substrate and an organic layer(s) is arranged so as to surround the whole or part of the auxiliary wiring layer while being apart from the auxiliary wiring layer so as not to be in contact with the auxiliary wiring layer. However, it is preferable to arrange the auxiliary wiring layer(s) 3 on the outside of the organic layer 4, because light emitted from the organic layer 4 is less liable to be obstructed. The auxiliary wiring layers 3 are not in contact with the first electrode 2. As will be described below, because it is not necessary to form the auxiliary wiring layers 3 on the first electrode 2, it is possible to prevent the occurrence of a short circuit caused by the contact with a mask to be used in the film deposition step, for example. It is to be noted that, as long as the auxiliary wiring layers 3 are connected electrically to the second electrode 5 as described above, the form of the electrical connection is not limited to the one achieved by the contact between the auxiliary wiring layers and the second electrode.

Figure 4:
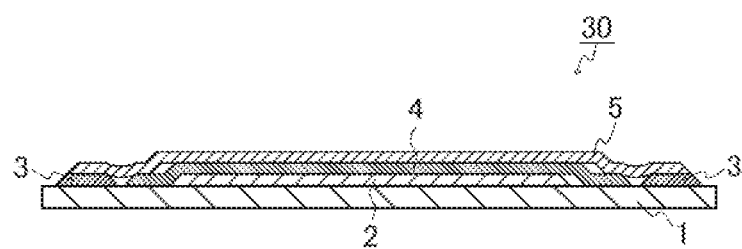
FIG. 4 is a sectional view showing a variation of the configuration of the organic EL element shown in FIG. 1.

The respective layers, namely, the first electrode 2, the auxiliary wiring layers 3, the organic layer 4, and the second electrode 5, preferably are formed so that edges thereof form an obtuse angle with the plane of the substrate 1, because it can reduce the risk of step disconnection of a layer formed on each of these layers, for example. The sectional view of FIG. 4 shows an example of this configuration. As shown in FIG. 4, this organic EL element 30 has the same configuration as the organic EL element 10 shown in FIG. 1A, except that edges of the respective layers, namely, the first electrode 2, the auxiliary wiring layers 3, the organic layer 4, and the second electrode 5, are tapered and form an obtuse angle with the plane of the substrate 1. In particular, in the organic EL element of the present invention, it is preferable that edges of the auxiliary wiring layers form an obtuse angle with the plane of the substrate, because it can reduce the risk of step disconnection of the second electrode (e.g., ITO) laminated on the auxiliary wiring layers. For example, in the organic EL element 30 shown in FIG. 4, owing to the fact that the edges of the auxiliary wiring layers 3 are tapered, the level difference in the gap between each auxiliary wiring layer 3 and the organic layer 4 becomes gradual. This allows the step disconnection to be less liable to occur in the second electrode 5.

The method for manufacturing the organic EL element 10 shown in FIG. 1 is not particularly limited, and can be carried out in the following manner, for example.

(First Electrode Forming Step)

First, a substrate 1 is provided. Next, on one surface of the substrate 1, a first electrode formed of ITO or the like is formed by, for example, sputtering. In this step, the first electrode may be patterned into a desired shape via a photolithography process. The photolithography process is not particularly limited, and can be performed in a conventionally known manner to be described below, for example. Specifically, first, an insulating photoresist is applied onto the substrate 1. Then, patterning of the photoresist is carried out by subjecting the photoresist to exposure via a photomask, developing, and baking. Then, the photoresist at a portion corresponding to the first electrode is removed. Further, a layer of the first electrode-forming material is formed on the entire surface of the substrate, and thereafter, the remaining photoresist is removed. Through this process, the electrode-forming material on a portion other than the first electrode-corresponding portion is lifted-off, whereby the patterning of the first electrode is completed.

(Auxiliary Wiring Layer Forming Step)

Next, auxiliary wiring layers 3 are formed on the outside of a position where an organic layer 4 is to be formed, so that the auxiliary wiring layers 3 would not be in contact with the organic layer 4. At this time, the auxiliary wiring layers 3 are formed so as not to be in contact with the first electrode 2. In the organic EL element 10 shown in FIG. 1, the auxiliary wiring layers 3 are arranged on the surface of the substrate 1 in such a manner that, as shown in FIG. 1, they are apart from the first electrode 2 on the outside of the first electrode 2 and also apart from the position where the organic layer 4 is to be formed on the outside of the position where the organic layer 4 is to be formed. This allows the auxiliary wiring layers 3 that are not in contact with the first electrode 2 and the organic layer 4 to be obtained. Either the step of forming the auxiliary wiring layers 3 (the auxiliary wiring layer forming step) or the step of forming the organic layer 4 (the organic layer forming step, which will be described below) may be performed first, or they may be performed at the same time. The auxiliary wiring layer forming step is not particularly limited, and can be carried out by, for example, sputtering, as in the case of the first electrode forming step. In this step, the auxiliary wiring layers may be patterned into a desired shape via a photolithography process. The photolithography process is not particularly limited. In the method for manufacturing the organic EL element according to the present invention, the auxiliary wiring layers are formed so as not to be in contact with the first electrode in the auxiliary wiring layer forming step, as described above. Thus, for example, in the photolithography process in the auxiliary wiring layer forming step, it is not necessary to use a shadow mask, whereby contact between the shadow mask and a film deposition surface of the first electrode can be prevented. Therefore, it is possible to prevent the first electrode from being damaged by asperities or metal particles present on the surface of the shadow mask. As a result, malfunctions such as a short circuit and leakage caused by such damage can be prevented.

(Organic Layer Forming Step)

Next, the organic layer 4 is formed on the first electrode. The method for forming the organic layer 4 is not particularly limited, and can be carried out by a conventionally known method such as vapor deposition, for example. More specifically, for example, when the light-emitting layer is formed of the above-described low molecular weight compound (low molecular weight organic EL material), the light-emitting layer can be formed by vacuum deposition achieved by resistance heating of the low molecular weight organic EL material, for example. On the other hand, when the light-emitting layer is formed of the above-described high molecular weight compound (high molecular weight organic EL material), for example, the light-emitting layer can be formed by applying the high molecular weight organic EL material according to a slit coating method, a flexographic printing method, an ink jet method, or the like, for example. In the organic EL element 10 shown in FIG. 1, although the organic layer 4 is formed so that, as described above, portions (both ends) thereof are in contact with the upper surface of substrate 1, the organic layer 4 may be configured so as not to be in contact with the upper surface.

(Second Electrode Forming Step)

Next, a second electrode 5 is formed on the organic layer 4. At this time, the second electrode 5 is formed so as to be connected electrically to the auxiliary wiring layers 3. In the organic EL element 10 shown in FIG. 1, as described above, each end portion of the second electrode 5 protrudes toward the outside of the organic layer 4 and is in direct contact with the upper surface of the auxiliary wiring layer 3 whereby the second electrode 5 is connected electrically to the auxiliary wiring layers 3. The second electrode forming step is not particularly limited, and can be carried out by, for example, sputtering, as in the case of the first electrode forming step. In this step, the second electrode may be patterned into a desired shape via a photolithography process. The photolithography process is not particularly limited, and can be carried out in the same manner as the photolithography process in the first electrode forming step or the auxiliary wiring layer forming step, for example.

Although the organic EL element 10 shown in FIG. 1 can be produced in the above-descried manner, the method for manufacturing the organic EL element 10 is not limited thereto, as described above. For example, the method for manufacturing the organic EL element 10 may or may not include a step(s) other than the first electrode forming step, the second electrode forming step, the organic layer forming step, and the auxiliary wiring layer forming step as appropriate.

Also, use of the organic EL element 10 is not particularly limited, and for example, the organic EL element 10 can be used for the same purposes as conventionally known organic EL elements. For example, the organic EL element 10 can be used in a display panel or the like.

Second Exemplary Embodiment

The following description is directed to another embodiment of the organic EL element of the present invention, configured so as to further include insulating layers.

Figure 3A:
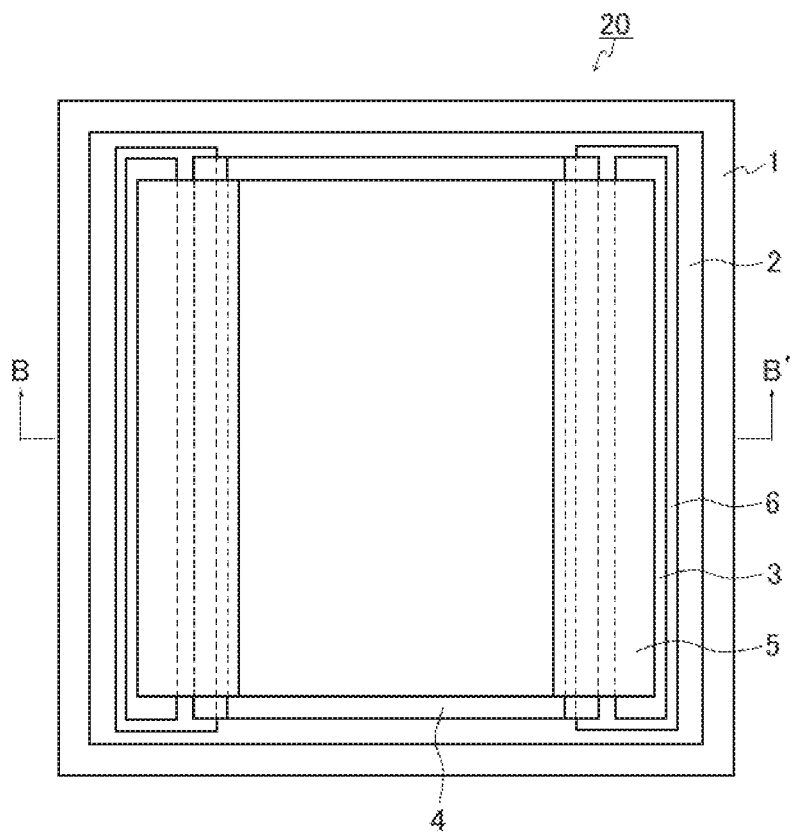
FIG. 3A is a top view (plan view) and FIG. 3B is a sectional view of the organic EL element.
Figure 3B:
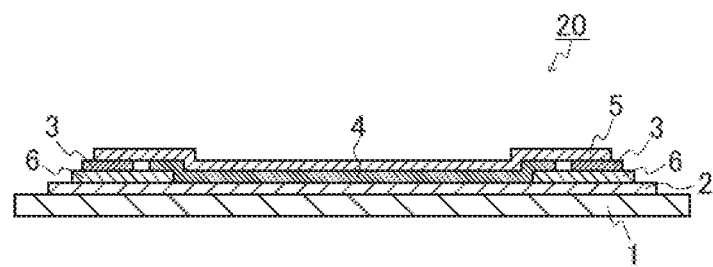

FIG. 3 shows the configuration of the organic EL element of the present embodiment. FIG. 3A is a top view (plan view) of the organic EL element, and FIG. 3B is a sectional view of the same, viewed along arrows B-B' in FIG. 3A. As shown in FIG. 3, this organic EL element 20 includes a substrate 1, a first electrode 2, auxiliary wiring layers 3, an organic layer 4 including a light-emitting layer, a second electrode 5, and in addition, insulating layers 6. In the organic EL element 10 shown in FIG. 1, the auxiliary wiring layers 3 are formed on the outside of the first electrode 2. In contrast, in the organic EL element 20 shown in FIG. 3, the auxiliary wiring layers 3 are formed on the first electrode 2. Instead, the insulating layers 6 are formed on the first electrode, and the auxiliary wiring layers 3 are laminated on the first electrode 2 via the insulating layers 6. With this configuration, the auxiliary wiring layers 3 are not in contact with the first electrode 2. Unlike the organic EL element 10 shown in FIG. 1, each end portion of the organic layer 4 does not protrude toward the outside of the first electrode 2 and is in contact with a portion of the upper surface of the insulating layer 6. Each of the auxiliary wiring layers 3 is arranged slightly apart from the organic layer 4 (at a position where the auxiliary wiring layer is not in contact with the organic layer 4) on the outside of the organic layer 4. Except for the above, the organic EL element 20 shown in FIG. 3 has the same configuration of as the organic EL element 10 shown in FIG. 1. By providing the insulating layers 6 in the organic EL element 20, it becomes possible to control the light emitting area (the area of a light-emitting part), for example. In the present invention, the arrangement of the insulating layers is not limited to the one shown in FIG. 3 and any arrangement may be employed, as long as: the insulating layers are sandwiched between the first electrode and the auxiliary wiring layers; and the insulating layers prevent the auxiliary wiring layers from being in contact with the first electrode. Although portions (both ends) of the organic layer 4 are in contact with the insulating layers 6 in FIG. 3, it is not always necessary that the organic layer 4 is in contact with the insulating layers 6.

A material for forming the insulating layers 6 is not particularly limited, and may be an inorganic material or a polymeric material, for example. Preferably, the insulating layers 6 are formed by a photolithography process using an insulating photoresist. Examples of the insulating photoresist include acrylic, novolac, and polyimide photosensitive polymeric materials. When the insulating layers 6 are formed using the insulating photoresist, the insulating layers 6 can be formed merely by performing a photolithography process, without performing a photoetching process, for example. Thus, it is possible to reduce the burden of the production processes. The thickness of the insulating layers 6 is not particularly limited, and may be, for example, about 400 to about 800 nm.

Figure 5:
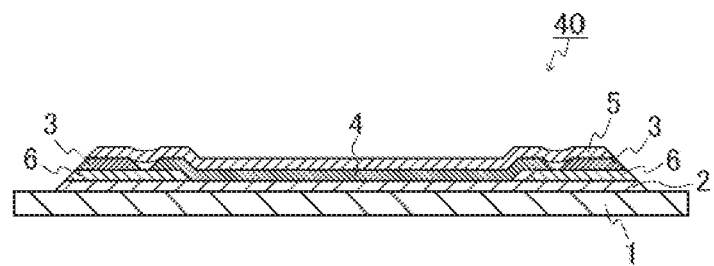
FIG. 5 is a sectional view showing a variation of the configuration of the organic EL element shown in FIG. 3.

As in the first exemplary embodiment, the respective layers, namely, the first electrode 2, the auxiliary wiring layers 3, the organic layer 4, the second electrode 5, and the insulating layers 6, preferably are formed so that edges thereof form an obtuse angle with the plane of the substrate 1, because it can reduce the risk of step disconnection of a layer formed on each of these layers, for example. The sectional view of FIG. 5 shows an example of this configuration. As shown in FIG. 5, this organic EL element 30 has the same configuration as the organic EL element 20 shown in FIG. 3A, except that edges of the respective layer, namely, the first electrode 2, the auxiliary wiring layers 3, the organic layer 4, the second electrode 5, and the insulating layers 6, are tapered and form an obtuse angle with the plane of the substrate 1. In particular, in the organic EL element 40 shown in FIG. 5, owing to the fact that the edges of the auxiliary wiring layers 3 are tapered, the level difference in the gap between each auxiliary wiring layer 3 and the organic layer 4 becomes gradual, and this allows the step disconnection to be less liable to occur in the second electrode 5, as in the case of the organic EL element 30 shown in FIG. 4.

The method for manufacturing the organic EL element 20 shown in FIG. 3 is not particularly limited. For example, it can be carried out in the same manner as the method for manufacturing the organic EL element 10 according to the first exemplary embodiment, except that: it further includes an insulating layer forming step of forming the insulating layers 6; and in the auxiliary wiring layer forming step, the auxiliary wiring layers 3 are formed on the insulating layers 6 so as not to be in contact with the first electrode 2. The insulating layer forming step is not particularly limited, and can be carried out by, for example, sputtering, as in the case of the first electrode forming step. In this step, the insulating layers may be patterned into a desired shape via a photolithography process. The photolithography process is not particularly limited, and can be carried out in the same manner as the photolithography process in the first electrode forming step, for example. In the method for manufacturing the organic EL element according to the present invention, the auxiliary wiring layers are formed so as not to be in contact with the first electrode in the auxiliary wiring layer forming step, as described above. To this end, for example, the auxiliary wiring layers 3 may be arranged on the outside of the first electrode 2 as shown in FIG. 1, or the auxiliary wiring layers 3 may be formed on the insulating layers 6 as shown in FIG. 3. By forming the auxiliary wiring layers so as not to be in contact with the first electrode, it is possible to prevent the first electrode from being damaged by asperities or metal particles present on the surface of a shadow mask in the auxiliary wiring layer forming step, and as a result, malfunctions such as a short circuit and leakage caused by such damage also can be prevented, as described above.

Also, use of the organic EL element 20 shown in FIG. 3 is not particularly limited, and for example, the organic EL element 20 also can be used for the same purposes as conventionally known organic EL elements, similarly to the organic EL element 10 shown in FIG. 1. For example, the organic EL element 20 can be used in a display panel or the like.

Third Exemplary Embodiment

The following description is directed to still another embodiment of the organic EL element of the present invention, configured so as to further include an insulating layer.

Figure 6A:
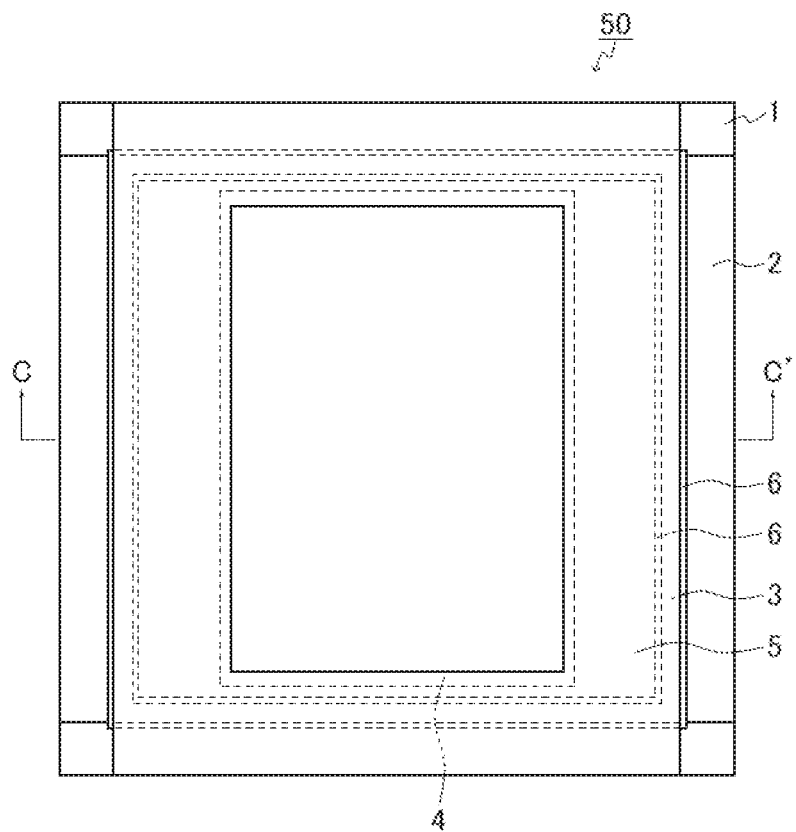
FIG. 6A is a top view (plan view) and FIG. 6B is a sectional view of the organic EL element.
Figure 6B:
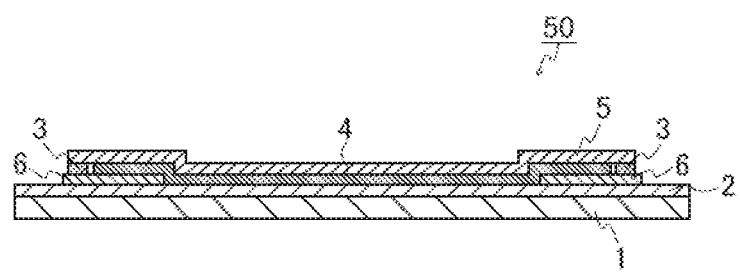

FIG. 6 shows the configuration of an organic EL element of the present embodiment. FIG. 6A is a top view (plan view) of the organic EL element, and FIG. 6B is a sectional view of the same, viewed along arrows C-C' in FIG. 6A. As shown in FIG. 6, the organic EL element of the present embodiment has the same configuration as the organic EL element of the second exemplary embodiment, except that an insulating layer 6 and an auxiliary wiring layer 3 are arranged so as to surround a second electrode 5. It is preferable to arrange the insulating layer 6 and the auxiliary wiring layer 3 so as to surround the second electrode 5 as in the present embodiment, from the viewpoint of further improving the uniformity in brightness. Although a portion (outer peripheral part) of the organic layer 4 is in contact with the insulating layer 6 in FIG. 6, it is not always necessary that the organic layer 4 is in contact with the insulating layer 6. Furthermore, as in the second exemplary embodiment, edges of the respective layers, namely, the first electrode 2, the auxiliary wiring layer 3, the organic layer 4, the second electrode 5, and the insulating layer 6, may be tapered so as to form an obtuse angle with the plane of the substrate 1 (not shown).

The method for manufacturing the organic EL element 50 shown in FIG. 6 is not particularly limited. For example, it can be carried out in the same manner as the method for manufacturing the organic EL element 20 according to the second exemplary embodiment, except that: in the insulating layer forming step and the auxiliary wiring layer forming step, the insulating layer 6 and the auxiliary wiring layer 3 are formed so that, as shown in FIG. 6, they surround a position where the second electrode 5 is to be formed; and in the organic layer forming step, the organic layer 4 is formed so that a portion (outer peripheral part) thereof is in contact with the insulating layer 6.

Also, use of the organic EL element 50 shown in FIG. 6 is not particularly limited, and for example, the organic EL element 50 can be used for the same purposes as conventionally known organic EL elements, similarly to the organic EL element 10 shown in FIG. 1. For example, the organic EL element 50 can be used in a display panel or the like.

EXAMPLES

Next, the present invention will be described with reference to examples. It is to be noted, however, that the present invention is by no means limited to or restricted by the following examples.

Example 1

An organic EL element 10 shown in FIG. 1 was produced in the following manner. Specifically, first, a glass substrate (thickness: 0.7 mm) was provided as a substrate 1. Then, on a surface of this substrate 1, an ITO film was formed by sputtering, and further, the ITO film was patterned into a predetermined shape. Thus, a first electrode 2 was formed.

Next, on the outside of the first electrode 2, a MAM layer (a laminate formed of Mo alloy-Al alloy-Mo alloy) was formed apart from the first electrode 2 so as not to be in contact with the first electrode 2 by sputtering. In this step, the MAM layer was patterned into a predetermined shape via a photolithography. Thus, auxiliary wiring layers 3 were formed. Furthermore, an organic layer 4 was formed by vapor deposition at a position where the organic layer 4 was not in contact with the auxiliary wiring layers 3 (apart from the auxiliary wiring layers 3) on the inner side with respect to the auxiliary wiring layers 3. At this time, as shown in FIG. 1, the organic layer 4 was formed in such a manner that portions thereof were in contact with the upper surface of the first electrode 2. Furthermore, an ITO film was formed on the organic layer 4 and the auxiliary wiring layers 3 by sputtering. Thus, a second electrode 5 was formed. In this manner, the organic EL element shown in FIG. 1 was produced.

Example 2

An organic EL element 20 shown in FIG. 3 was produced in the following manner. Specifically, first, a glass substrate (thickness: 0.7 mm) was provided as a substrate 1. Then, on a surface of this substrate 1, an ITO film was formed by sputtering, and further, the ITO film was patterned into a predetermined shape. Thus, a first electrode 2 was formed.

Next, an acrylic resist was applied onto the entire surface of the first electrode 2, and the resist was patterned into a predetermined shape. Thus, insulating layers 6 were formed. On the insulating layers 6, a MAM layer (a laminate of Mo alloy-Al alloy-Mo alloy) was formed by sputtering. In this step, the MAM layer was patterned into a predetermined shape via a photolithography. Thus, auxiliary wiring layers 3 were formed. Furthermore, on the first electrode 2, an organic layer 4 was formed by vapor deposition at a position where the organic layer 4 was not in contact with the auxiliary wiring layers 3 (apart from the auxiliary wiring layers 3) on the inner side with respect to the auxiliary wiring layers 3. At this time, as shown in FIG. 3, the organic layer 4 was formed in such a manner that both ends thereof were in contact with the upper surfaces of the insulating layers 6. Furthermore, an ITO film was formed on the organic layer 4 and the auxiliary wiring layers 3 by sputtering. Thus, a second electrode 5 was formed. In this manner, the organic EL element shown in FIG. 3 was produced.

Example 3

An organic EL element 50 shown in FIG. 6 was produced in the following manner. Specifically, first, a glass substrate (thickness: 0.7 mm) was provided as a substrate 1. Then, on a surface of this substrate 1, an ITO film was formed by sputtering, and further, the ITO film was patterned into a predetermined shape. Thus, a first electrode 2 was formed.

Next, an acrylic resist was applied onto the entire surface of the first electrode 2, and the resist was patterned into a predetermined shape. Thus, an insulating layer 6 was formed. On the insulating layer 6, a MAM layer (a laminate of Mo alloy-Al alloy-Mo alloy) was formed by sputtering. In this step, the MAM layer was patterned into a predetermined shape via a photolithography. Thus, an auxiliary wiring layer 3 was formed. Furthermore, on the first electrode 2, an organic layer 4 was formed by vapor deposition at a position where the organic layer 4 was not in contact with the auxiliary wiring layer 3 (apart from the auxiliary wiring layer 3) on the inner side with respect to the auxiliary wiring layer 3. At this time, as shown in FIG. 6, the organic layer 4 was formed in such a manner that the outer peripheral part thereof was in contact with the upper surface of the insulating layer 6. Furthermore, an ITO film was formed on the organic layer 4 and the auxiliary wiring layer 3 by sputtering. Thus, a second electrode 5 was formed. In this manner, the organic EL element shown in FIG. 6 was produced.

Reference Example

An organic EL element according to a reference example was produced in the same manner as in Example 1, except that the auxiliary wiring layers 3 were not formed.

Comparative Example

An organic EL element according to a comparative example was produced in the same manner as in Example 1, except that the auxiliary wiring layers 3 were formed using a shadow mask after the formation of the ITO film (first electrode) 2, and the thus-formed auxiliary wiring layers 3 were arranged so as to be in contact with the ITO film (first electrode) 2.

Regarding the organic EL elements of Example 1 to 3, the reference example, and the comparative example produced in the above described manners, uniformity in brightness during current application, the number of short circuits, and leakage were evaluated. As a result, the organic EL elements of Examples 1 to 3 including the auxiliary wiring layer(s) achieved improved uniformity in brightness as compared with the organic EL element of the reference example not including an auxiliary wiring layer. In particular, in the organic EL element of Example 3, the uniformity in brightness was improved notably. Furthermore, in the organic EL elements of Examples 1 to 3 in which the auxiliary wiring layer(s) was not in contact with the first electrode, the number of short circuits and leakage were reduced as compared with those in the organic EL element of the comparative example in which the auxiliary wiring layers were in contact with the first electrode. The reason for this is that, because the organic EL elements of Examples 1 to 3 were produced without using a shadow mask, contact between the shadow mask and the first electrode 2 did not occur at the time of forming the auxiliary wiring layers 3, so that the first electrode 2 was prevented from being damaged by asperities or metal particles present on the surface of the shadow mask. In contrast, in the organic EL element of the comparative example, the shadow mask used to form the auxiliary wiring layers 3 came into contact with the first electrode 2 and damaged the first electrode 2. Thus, owing to the damage, short circuits and leakage occurred in the first electrode 2.

While the present invention has been described above with reference to illustrative embodiments, the present invention is by no means limited thereto. Various changes and modifications that may become apparent to those skilled in the art may be made in the configuration and specifics of the present invention without departing from the scope of the present invention.

Part or the whole of the exemplary embodiments disclosed above can be described as in the following supplementary notes. It is to be noted, however, that the present invention is by no means limited thereto.

(Supplementary Note 1)
An organic electroluminescence element including:
a substrate;
a first electrode;
a second electrode;
an organic layer including a light-emitting layer; and
an auxiliary wiring layer,
the first electrode, the organic layer, and the second electrode being laminated on one surface of the substrate in this order,
the organic layer being connected electrically to both the electrodes,
wherein the auxiliary wiring layer is arranged at a position where the auxiliary wiring layer is not in contact with the organic layer,
the auxiliary wiring layer is connected electrically to the second electrode, and
the auxiliary wiring layer is not in contact with the first electrode.

(Supplementary Note 2)
The organic electroluminescence element according to Supplementary Note 1, wherein the auxiliary wiring layer is arranged at a position where the auxiliary wiring layer is not in contact with the organic layer on the outside of the organic layer.

(Supplementary Note 3)
The organic electroluminescence element according to Supplementary Note 1 or 2, wherein, on the surface of the substrate, the auxiliary wiring layer is formed at a position where the auxiliary wiring layer is not in contact with the first electrode on the outside of the first electrode.

(Supplementary Note 4)
The organic electroluminescence element according to Supplementary Note 1 or 2, further including an insulating layer,
wherein the insulating layer is formed on the first electrode, and
the auxiliary wiring layer is laminated on the first electrode via the insulating layer,
whereby the auxiliary wiring layer is not in contact with the first electrode.

(Supplementary Note 5)
The organic electroluminescence element according to any one of Supplementary Notes 1 to 4,
wherein the auxiliary wiring layers are arranged on both end sides of the second electrode.

(Supplementary Note 6)
The organic electroluminescence element according to Supplementary Note 4, wherein the auxiliary wiring layer is arranged so as to surround the second electrode.

(Supplementary Note 7)
The organic electroluminescence element according to any one of Supplementary Notes 1 to 6, wherein an edge of the auxiliary wiring layer forms an obtuse angle with the substrate plane.

(Supplementary Note 8)
A display panel including:
the organic electroluminescence element according to any one of Supplementary Notes 1 to 7.

(Supplementary Note 9)
A method for manufacturing an organic electroluminescence element, including:
a first electrode forming step of forming a first electrode on one surface of a substrate;
an organic layer forming step of forming an organic layer including a light-emitting layer on the first electrode;
a second electrode forming step of forming a second electrode on the organic layer; and
an auxiliary wiring layer forming step of forming an auxiliary wiring layer at a position where the auxiliary wiring layer is not in contact with the organic layer,
wherein, in the auxiliary wiring layer forming step, the auxiliary wiring layer is formed so as not to be in contact with the first electrode, and in the auxiliary wiring layer forming step or the second electrode forming step, the auxiliary wiring layer is connected electrically to the second electrode.

(Supplementary Note 10)

The manufacturing method according to Supplementary Note 9, wherein the auxiliary wiring layer is formed on the outside of a region where the organic layer is to be formed, so that the auxiliary wiring layer is not in contact with the organic layer.

(Supplementary Note 11)

The manufacturing method according to Supplementary Note 9 or 10, wherein, in the auxiliary wiring layer forming step, the auxiliary wiring layer is formed at a position where the auxiliary wiring layer is not in contact with the first electrode on the outside of the first electrode on the surface of the substrate.

(Supplementary Note 12)

The manufacturing method according to Supplementary Note 9 or 10, further including an insulating layer forming step of forming an insulating layer on the first electrode, wherein, in the auxiliary wiring layer forming step, the auxiliary wiring layer is formed on the insulating layer so as not to be in contact with the first electrode.

(Supplementary Note 13)

The manufacturing method according to any one of Supplementary Notes 9 to 12, wherein, in the auxiliary wiring layer forming step, the auxiliary wiring layer is formed without performing patterning using a shadow mask.

This application claims priority from Japanese Patent Application No. 2013-123188 filed on Jun. 11, 2013. The entire disclosure of this Japanese patent application is incorporated herein by reference.

EXPLANATION OF REFERENCE NUMERALS

1: substrate
2: first electrode
3: auxiliary wiring layer
4: organic layer
5: second electrode
6: insulating layer
10, 20, 30, 40, 50: organic EL element

The invention claimed is:

1. An organic electroluminescence element comprising:
a substrate;
a first electrode;
a second electrode;
an organic layer comprising a light-emitting layer; and
an auxiliary wiring layer,
the first electrode, the organic layer, and the second electrode being laminated on one surface of the substrate in this order,
the organic layer being connected electrically to both the electrodes,
wherein the auxiliary wiring layer is arranged at a position where the auxiliary wiring layer is not in contact with the organic layer,
the auxiliary wiring layer is connected electrically to the second electrode, and
the auxiliary wiring layer is not in contact with the first electrode.

2. The organic electroluminescence element according to claim 1, further comprising an insulating layer,
wherein the insulating layer is formed on the first electrode, and
the auxiliary wiring layer is laminated on the first electrode via the insulating layer, whereby the auxiliary wiring layer is not in contact with the first electrode.

3. The organic electroluminescence element according to claim 2, wherein the auxiliary wiring layer is arranged so as to surround the second electrode.

4. The organic electroluminescence element according to claim 3, wherein an edge of the auxiliary wiring layer forms an obtuse angle with the substrate plane.

5. A display panel comprising:
the organic electroluminescence element according to claim 3.

6. The organic electroluminescence element according to claim 2, wherein an edge of the auxiliary wiring layer forms an obtuse angle with the substrate plane.

7. A display panel comprising:
the organic electroluminescence element according to claim 2.

8. The organic electroluminescence element according to claim 1, wherein, on the surface of the substrate, the auxiliary wiring layer is formed at a position where the auxiliary wiring layer is not in contact with the first electrode on the outside of the first electrode.

9. A display panel comprising:
the organic electroluminescence element according to claim 8.

10. The organic electroluminescence element according to claim 1, wherein an edge of the auxiliary wiring layer forms an obtuse angle with the substrate plane.

11. A display panel comprising:
the organic electroluminescence element according to claim 10.

12. The organic electroluminescence element according to claim 8, wherein an edge of the auxiliary wiring layer forms an obtuse angle with the substrate plane.

13. A display panel comprising:
the organic electroluminescence element according to claim 12.

14. A display panel comprising:
the organic electroluminescence element according to claim 1.

15. A method for manufacturing an organic electroluminescence element, the method comprising:
a first electrode forming step of forming a first electrode on one surface of a substrate;
an organic layer forming step of forming an organic layer comprising a light-emitting layer on the first electrode;
a second electrode forming step of forming a second electrode on the organic layer; and
an auxiliary wiring layer forming step of forming an auxiliary wiring layer at a position where the auxiliary wiring layer is not in contact with the organic layer,
wherein, in the auxiliary wiring layer forming step, the auxiliary wiring layer is formed so as not to be in contact with the first electrode, and
in the auxiliary wiring layer forming step or the second electrode forming step, the auxiliary wiring layer is connected electrically to the second electrode.

16. The manufacturing method according to claim 15, wherein, in the auxiliary wiring layer forming step, the auxiliary wiring layer is formed at a position where the auxiliary wiring layer is not in contact with the first electrode on the outside of the first electrode on the surface of the substrate.

17. The manufacturing method according to claim 16, wherein, in the auxiliary wiring layer forming step, the auxiliary wiring layer is formed without performing patterning using a shadow mask.

18. The manufacturing method according to claim 15, further comprising an insulating layer forming step of forming an insulating layer on the first electrode,
   wherein, in the auxiliary wiring layer forming step, the auxiliary wiring layer is formed on the insulating layer so as not to be in contact with the first electrode.

19. The manufacturing method according to claim 18, wherein, in the auxiliary wiring layer forming step, the auxiliary wiring layer is formed without performing patterning using a shadow mask.

20. The manufacturing method according to claim 15, wherein, in the auxiliary wiring layer forming step, the auxiliary wiring layer is formed without performing patterning using a shadow mask.

* * * * *